United States Patent [19]

Sawada et al.

[11] Patent Number: 5,747,727
[45] Date of Patent: May 5, 1998

[54] METHOD OF MAKING A THERMOCOUPLE

[75] Inventors: Kazuo Sawada; Shinji Inazawa; Kouichi Yamada, all of Osaka, Japan

[73] Assignee: Sumitomo Electric Industries, Ltd., Osaka, Japan

[21] Appl. No.: 845,576

[22] Filed: Apr. 25, 1997

Related U.S. Application Data

[60] Continuation-in-part of Ser. No. 442,386, May 16, 1995, abandoned, which is a division of Ser. No. 325,536, Oct. 18, 1994, Pat. No. 5,498,296, which is a continuation-in-part of Ser. No. 839,754, Apr. 7, 1992, abandoned.

[30] Foreign Application Priority Data

| Aug. 9, 1990 | [JP] | Japan | 2-213366 |
| Jul. 22, 1991 | [JP] | Japan | 3-181096 |
| Jul. 23, 1991 | [JP] | Japan | 3-182604 |

[51] Int. Cl.$^6$ ............ H01L 35/34; C25D 9/08; C25D 13/00

[52] U.S. Cl. .......... 136/201; 136/230; 136/236.1; 204/484; 204/499; 204/500; 204/507; 204/509; 205/316; 205/333; 427/126.3; 427/226; 427/434.6; 427/435

[58] Field of Search .............. 136/201, 236.1, 136/238, 239, 230, 232, 233; 205/316, 333; 427/226, 126.3, 435, 434.6; 204/484, 486, 487, 488, 490, 499, 500, 506, 509, 507

[56] References Cited

U.S. PATENT DOCUMENTS

| 2,356,575 | 8/1944 | Frasch | 204/56 |
| 2,495,630 | 1/1950 | Dorst | 117/70 |
| 2,567,162 | 9/1951 | Sanders | 117/70 |
| 2,571,700 | 10/1951 | Ford | 136/4 |
| 2,754,353 | 7/1956 | Gilliam | 174/120 |
| 3,328,201 | 6/1967 | Scheible | 117/215 |
| 3,328,281 | 6/1967 | Marshall | 204/279 |
| 3,332,807 | 7/1967 | Boehmer et al. | 136/203 |
| 3,617,376 | 11/1971 | Miller | 117/221 |
| 3,783,031 | 1/1974 | Chad | 136/237 |
| 3,833,387 | 9/1974 | Reed et al. | 106/49 |
| 4,224,461 | 9/1980 | Snyder, Jr. | 136/233 |
| 4,237,186 | 12/1980 | Ingraham | 428/379 |

(List continued on next page.)

FOREIGN PATENT DOCUMENTS

| 631735 | 11/1961 | Canada | 136/233 |
| 970487 | 9/1956 | Germany . | |
| 1267297 | 5/1968 | Germany . | |
| 58-123782 | 7/1983 | Japan . | |
| 60-41473 | 9/1985 | Japan . | |
| 3-183318 | 8/1989 | Japan . | |
| 469323 | 4/1969 | Switzerland . | |

OTHER PUBLICATIONS

International Standard ISO 468, article entitled: Surface Roughness—Parameters, Their Values and General Rules for Specifying Requirements; First Edition—1982–Aug. 1, pp. 1–3.

Boron—Nitride Protective Coating For Tungsten—Rhenium, Thermocpoules, by F. Ya. Gimel'shein et al. 2353 Measurement Techniques 26, Dec. 1983, No. 12, pp. 1014–1015.

High Voltage Isolation of Thermocouples for Ion Plating by M. Duncan et al. IEEE Southeastcon, Apr., 1988, pp. 511–514.

Primary Examiner—Kathryn L. Gorgos
Assistant Examiner—Chrisman D. Carroll
Attorney, Agent, or Firm—W. G. Fasse; W. F. Fasse

[57] ABSTRACT

A metal oxide layer is provided around a thermocouple element. The metal oxide layer is formed by preparing a sol, in which particulates of a metal oxide are dispersed, by a sol-gel method, dipping the thermocouple element in this sol, energizing the thermocouple element as a cathode for bonding the precursor particulates of the metal oxide thereto, and heat treating the same. The thermocouple according to the present invention is compact with a thin insulating layer, excellent in flexibility, and provides no gas adsorption source.

25 Claims, 2 Drawing Sheets

U.S. PATENT DOCUMENTS

| | | | |
|---|---|---|---|
| 4,328,048 | 5/1982 | Senda et al. | 148/6.31 |
| 4,647,710 | 3/1987 | Davis | 136/237 |
| 4,759,949 | 7/1988 | Pavlik et al. | 427/47 |
| 4,814,202 | 3/1989 | Castelas | 427/226 |
| 4,882,014 | 11/1989 | Coyle et al. | 204/1.5 |
| 4,921,731 | 5/1990 | Clark et al. | 427/314 |
| 4,935,265 | 6/1990 | Pike | 427/226 |
| 4,965,091 | 10/1990 | Fratello et al. | 427/64 |
| 5,057,370 | 10/1991 | Fayeulle et al. | 428/632 |
| 5,069,726 | 12/1991 | Ragless | 136/201 |
| 5,112,676 | 5/1992 | Cot et al. | 427/226 |
| 5,120,707 | 6/1992 | Maxfield et al. | 205/1 |
| 5,175,027 | 12/1992 | Holmes-Farley et al. | 427/387 |
| 5,182,143 | 1/1993 | Holmes-Farley et al. | 427/409 |
| 5,211,822 | 5/1993 | Alary et al. | 204/180.7 |

1

METHOD OF MAKING A THERMOCOUPLE

CROSS-REFERENCE TO RELATED APPLICATIONS

This application is a continuation-in-part of U.S. application Ser. No. 08/442,386, filed on May 16, 1995, now abandoned, which in turn is a divisional of U.S. application Ser. No. 08/325,536, filed on Oct. 18, 1994, U.S. Pat. No. 5,498,296, which is a continuation-in-part application of U.S. application Ser. No. 07/839,754, filed on Apr. 7, 1992 and now abandoned.

FIELD OF INVENTION

The present invention relates to a thermocouple, which is employed for thermometry.

BACKGROUND INFORMATION

Thermocouples generally known in the art are, for example, those comprising a conductor passing through an insulator tube of ceramics, a sheathed thermocouple comprising a thermocouple element passing through a tube of a heat resistant alloy, such as a stainless steel alloy, which is filled with particulates of a metal oxide such as magnesium oxide, and the like.

The thermocouple which is insulated by an insulator tube of ceramics has disadvantages such as inferior flexibility and bulkiness. When such a thermocouple is employed under a high vacuum, the insulator adsorbs a large amount of gases since the insulator is essentially porous and has a large surface area.

In the sheathed thermocouple, which is formed by a heat resistant alloy tube and a thermocouple element, on the other hand, the outer diameter is increased and the ends are hard to process.

SUMMARY OF THE INVENTION

An object of the present invention is to provide a thermocouple which is compact and has a thin insulating layer, excellent flexibility, and no gas adsorption source.

The thermocouple according to the present invention comprises a thermocouple element which is coated with a metal oxide layer.

FIG. 1 illustrates a thermocouple comprising a thermocouple element 2 which is coated with a metal oxide layer 1 according to the present invention.

According to the present invention, the metal oxide layer is formed by preparing a sol, in which precursor particulates of a metal oxide are dispersed, by a sol-gel method, dipping a thermocouple element in this sol, applying a voltage to the thermocouple element as a cathode thereby bonding the precursor particulates of the metal oxide thereto, and then heat treating the same.

According to the present invention, it is possible to add an organic compound salt and/or an inorganic salt of a metal, in order to reduce the conductivity and improve the electrophoretic efficiency of the sol dispersion medium.

According to the present invention, the sol in which the thermocouple element is dipped, is preferably prepared by the hydrolytic reaction and condensation reaction of metal alkoxide or metal carboxylic ester corresponding to the metal oxide.

The metal oxide preferably contains at least one compound selected from the group consisting of silicon oxide, aluminum oxide, zirconium oxide and magnesium oxide.

2

Most preferably, the metal oxide insulating material is silicon oxide, and the thermocouple elements are "ALUMEL" and "CHROMEL" elements, for example of a K-type or CA-type thermocouple.

The sol in which the thermocouple element is dipped can contain ceramics powder. Such ceramics powder is preferably at least one compound selected from mica powder, silicon oxide, silicon nitride, silicon carbide, aluminum oxide, boron nitride and aluminum nitride.

According to the present invention, a metal-organic oligomer or a metal-organic monomer for forming an insulating ceramics layer preferably contains silica, alumina, zirconia, silicon nitride, silicon carbide, aluminum nitride, or a mixture thereof, or partially stabilized zirconia.

According to the present invention, the surface of the thermocouple element is preferably oxidized by heating. Due to such oxidation treatment, it is possible to improve the adhesion of the metal oxide layer to the thermocouple element.

Further according to the invention, an important feature achieved by the present sol-gel method is that the metal oxide insulating layer preferably has a higher melting temperature than the thermocouple element. In other words, the thermocouple element can have a lower melting temperature than the metal oxide insulating layer. In this manner, the insulating layer can provide improved resistance to high temperatures. This advantageous feature is a direct result of the present sol-gel method, and cannot be achieved by various prior art methods that use hot-melt dipping or coating, for example, because a molten coating layer would necessarily melt the thermocouple element, because of its lower melting temperature.

Another structural advantage of the thermocouple of the present invention achieved by the present method is that the metal oxide insulating layer can be relatively thick while still maintaining good adhesion to the thermocouple element and good resistance to cracking. More specifically, the insulating layer is at least about 2 μm thick and preferably between about 2 μm and about 10 μMm thick. It is difficult to obtain an insulating layer at least 2 μm thick by CVD (chemical vapor deposition) or EBE (electron beam evaporation) methods, rather than the present sol-gel method, because an extremely long deposition time would be required and other difficulties would arise. Furthermore, the oxidized surface of the thermocouple element according to the present invention enhances the adhesion between the insulating layer and the thermocouple element so that the present thicker layer is still resistant to cracking, chipping and spalling, even when the coated thermocouple element is bent to a diameter of curvature of from 1 mm to 100 mm.

In a first preferred mode of the present invention, an insulating ceramics layer is further provided on the outer side of the metal oxide layer. The insulating ceramics layer is formed by heating and decomposing at least one of a metal-organic polymer, a metal-organic oligomer and a metal-organic monomer.

In the first mode, the insulating ceramics layer is preferably formed by repeating a process of applying and firing a solution of proper concentration containing at least one of a metal-organic polymer, a metal-organic oligomer and a metal-organic monomer. Namely, it is preferable to reduce the thickness of a film that would be formed by a single application and firing process, by stacking or layering thin films. Such thin films are so stacked that, even if the surface of the metal oxide layer is significantly cracked or irregularized, the insulating ceramics layer can permeate such cracks or irregular portions to smooth the same. Thus, the insulating ceramics layer may be formed to be impregnated into the metal oxide layer.

FIG. 2 is a sectional view illustrating an embodiment according to the first mode of the present invention. Referring to FIG. 2, a metal oxide layer 12 is provided around a thermocouple element 11. Further, an insulating ceramics layer 13 is provided around the metal oxide layer 12.

In a second preferred mode of the present invention, a heat resistant organic resin layer is further provided on the outer side of the metal oxide layer. The heat resistant organic resin layer is preferably prepared from a compound selected from the group of polyimide, polyamideimide and silicone resin. This heat resistant organic resin layer serves as an effective protective layer for the metal oxide layer, under environments of not more than about 300° C., to improve flexibility as well as wear resistance.

FIG. 3 is a sectional view illustrating an embodiment according to the second mode. Referring to FIG. 3, a metal oxide layer 22 is provided around a thermocouple element 21. A heat resistant organic resin layer 23 is provided around the metal oxide layer 22.

A thermocouple is a device used for a thermometry technique utilizing a thermoelectromotive force caused by the Seebeck effect. The value of this thermoelectromotive force results from the compositions of two different types of metals which are in contact with each other. Therefore, it is impossible to form a stainless steel alloy or the like, to which ceramics is easily bonded as described in Japanese Patent Application No. 1-322376, on the surface of a thermocouple element.

According to the present invention, a thermocouple element is dipped in a sol in which precursor particulates of a metal oxide are dispersed, and the thermocouple element is energized as a cathode, thereby electrophoresing the precursor particulates of the metal oxide so that the same are electrically deposited on the surface of the thermocouple element.

According to the present invention, further, it is possible to add an organic compound salt and/or an inorganic salt, in order to reduce the conductivity and improve the electrophoretic efficiency of the sol by suppressing electrolysis of water during the electrophoresis. As a result, the consumption of electrical energy during electrophoresis is reduced, and the generation of hydrogen gas is reduced or suppressed so as to reduce or avoid flaking and pitting of the deposited coating as the electrophoresis progresses. Thus, the electrophoretic efficiency is so improved that the precursor particulates of the metal oxide can be bonded to the surface of the thermocouple element under a lower applied voltage and/or in a shorter energization time. Consequently, it is possible to form a thick ceramics coating.

An organic compound salt for reducing the conductivity and improving the electrophoretic efficiency of the sol is prepared from organic ammonium salt which is employed as an interphase moving catalyst. An organic salt of a metal can be prepared from at least one compound selected from nitrates, sulfates, chlorides and hydroxides of aluminum, magnesium, potassium and zirconium.

In order to obtain a large film thickness, fine powder of ceramics may be mixed into the sol of the precursor of the metal oxide. Such ceramics fine powder can be prepared from at least one compound selected from a group of mica powder, silicon oxide, silicon nitride, silicon carbide, silicon oxide and aluminum nitride.

In the aforementioned first mode, an insulating ceramics layer is further provided on the outer side of the as-formed metal oxide layer. Such an insulating ceramics layer is formed by heating and decomposing at least one of a metal-organic polymer, a metal-organic oligomer and a metal-organic monomer. Even if cracks or irregular portions are present on the surface of the metal oxide layer, therefore, it is possible to smooth the surface of the thermocouple by the insulating ceramics layer which is provided thereon. Due to such smoothing, it is possible to reduce the surface area as well as to reduce gas adsorption sources. Therefore, the thermocouple according to this mode is suitable particularly for application under an ultrahigh vacuum or the like.

According to the present invention, it is possible to reduce the thickness of the insulating film since high insulability can be attained even if the thickness is reduced. Thus, it is possible to attain excellent flexibility. However, as discussed above, the insulating layer should not be too thin (less than 2 μm thick), and excellent resistance to cracking is still maintained.

In the aforementioned second mode, the heat resistant organic resin layer which is excellent in flexibility covers the metal oxide layer, whereby the thermocouple can be further improved in flexibility as a whole.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
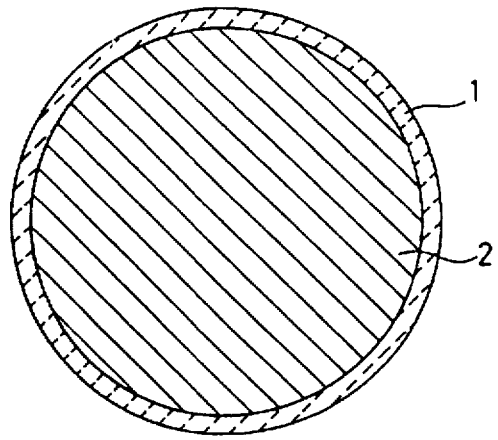
FIG. 1 is a sectional view illustrating an embodiment of the present invention.
Figure 2:
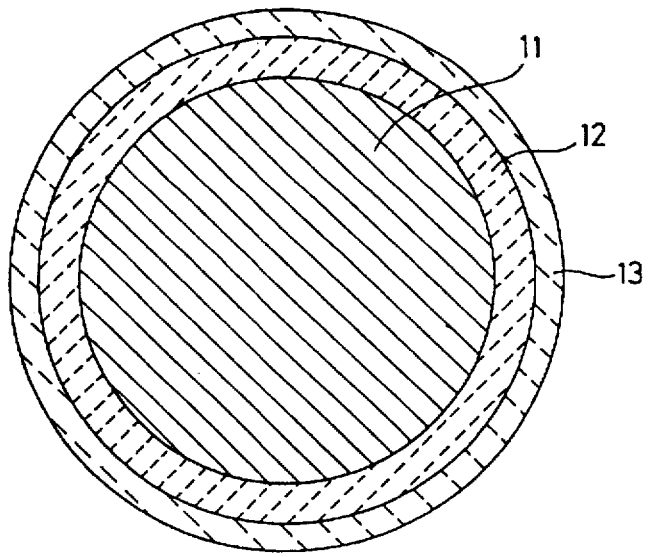
FIG. 2 is a sectional view illustrating another embodiment of the present invention.
Figure 3:
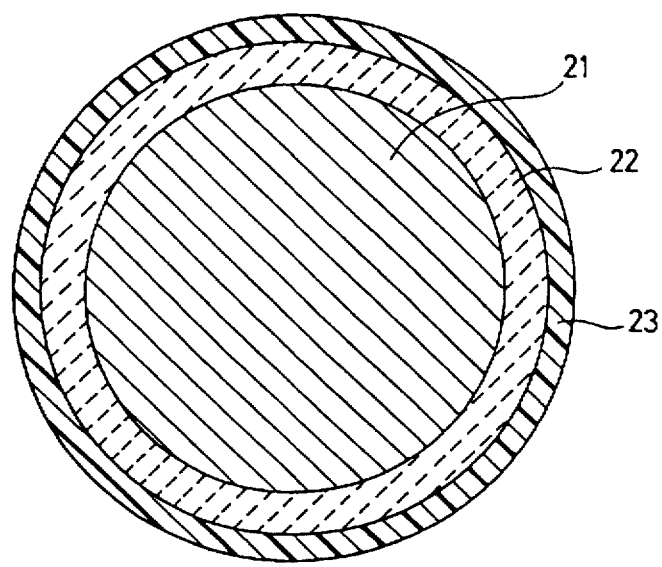
FIG. 3 is a sectional view illustrating still another embodiment of the present invention.

Four examples were prepared according to the modes and embodiments of the invention described above in the Summary of the Invention and shown in FIGS. 1 to 3, as also described above. In each example, respective thermocouple elements were prepared, to make K-type or CA-thermocouples. Throughout this description, "K-type" refers to the ISA (Instrument Society of America) standard designation for "CHROMEL"-"ALUMEL" thermocouples (i.e. thermocouples including two legs made of these two high nickel alloys of specific compositions). Similarly, "CA-thermocouples" herein refers generally to "CHROMEL"-"ALUMEL" thermocouples.

EXAMPLE 1

Respective thermocouple elements of a plus leg (alloy mainly composed of nickel and chromium) and a minus leg (alloy mainly composed of nickel) for a K-type thermocouple, 1.0 mm in diameter, were first heat treated in the atmosphere at 900° C. for 15 minutes.

Nitric acid was added to a mixed solution containing 4 mole percent of tetraethylorthosilicate, 40 mole percent of water and 56 mole percent of ethyl alcohol by an amount of 1/100 with respect to the molar amount of tetraethylorthosilicate and reacted at a temperature of 80° C. for 2 hours, thereby preparing a sol. 10 mg of aluminum nitrate six hydrate was added to 100 ml of such a sol solution at room temperature.

The aforementioned thermocouple elements were dipped in the sol prepared in the above manner, and a DC voltage of 200 V was applied thereto for 5 seconds. When the thermocouple elements were taken out of the sol, white films about 10 μm thick were formed as gels on the surfaces of the thermocouple elements.

The respective thermocouple elements of the plus and minus legs thus coated with the gels were heated at 670° C. for 10 minutes. After the heating, it was recognized that silicon-alumina composite films of 2 μm thickness were formed.

Ends of the respective thermocouple elements of the plus and minus legs obtained in the aforementioned manner were melted and bonded to each other to form a thermocouple, which in turn attained excellent results up to 700° C.

Further examples were provided with insulating ceramics layers on the outer surface of metal oxide layers according to the invention, and will now be described.

EXAMPLE 2

Respective thermocouple elements of a plus leg (alloy mainly composed of nickel and chromium) and a minus leg (alloy mainly composed of nickel) for a K-type thermocouple, 0.65 mm in diameter, were heat treated in the atmosphere at 800° C. for 15 minutes.

Then, a mixed solution of 5 mole percent of tetrabutoxy zirconium, 8 mole percent of water, 10 mole percent of glacial acetic acid and 77 mole percent of butyl alcohol was prepared, and further stirred at room temperature for 2 hours, to prepare a sol solution. 2 g of yttrium nitrate six hydrate was added to 100 ml of this sol solution at room temperature.

The aforementioned thermocouple elements were dipped in the Sol prepared in the above manner, and a DC voltage of 200 V was applied thereto for 30 seconds. As the result, white films about 20 pm thick were formed as gels on the surfaces of the thermocouple elements.

The respective thermocouple elements of the plus and minus legs thus coated with the gels were heated at 900° C. for 10 minutes, and thereafter furnace-cooled. After the cooling, it was recognized that yttria-partially stabilized zirconia films of 2 μm thickness were formed.

Then, 40 g of 1,1,1,3,3,3,-hexamethyldisilazane and 15 g of trichlorosilane were mixed under a nitrogen jet and stirred at 70° C. for 5 hours. Further, distillation was performed at 160° C. to distill and remove by-products. Then, vacuum distillation was performed at 120° C. under 5 mmHg to completely remove the by-products, thereby obtaining 5 g of polysilazane.

The by-products herein referred to are mainly composed of trimethylchlorosilane and oligosilazane. The polysilazane was diluted by 5 times with toluene, thereby obtaining a coating solution containing a ceramics precursor.

The aforementioned thermocouple elements provided with the yttria-partially stabilized zirconia films were dipped in this coating solution. Thus, the outer surfaces of the thermocouple elements were coated with the coating solution, and heated under a nitrogen atmosphere at 700° C. for 10 minutes. This coating and heating step was repeated 10 times in total. Samples 30 cm in length were collected from the as-obtained thermocouple elements. Platinum foils of 0.02 mm thickness were closely wound on the samples on four portions about 10 mm in length, which were separated from each other at intervals of about 50 mm. An AC voltage of 60 Hz was applied across the conductors and the metal foils, resulting in dielectric breakdown at 500 V. When the insulated sample wires were bent, insulability was maintained even if the wires were bent to diameters of 50 mm. These thermocouple elements were melted and bonded to each other to form a thermocouple, which in turn attained excellent results up to 700° C.

As to the surface conditions of the thermocouple elements, the center line average height Ra was 0.03 μm and the maximum height Ry was 0.21 μm according to Surface Roughness of ISO468-1982. The measurement was carried out with a "DEKTAK 3030®" surface profile measuring system from the Sloan Technology Division of Veeco Instruments, Inc., Santa Barbara, Calif., U.S.A., with a stylus diameter of 0.5 μm, a stylus pressure of 10 mg and a reference length of 1 μm, while employing no cut-off filter.

Further examples were provided with heat resistant organic resin layers on the outer surface of metal oxide layers according to the invention, and will now be described.

EXAMPLE 3

Respective thermocouple elements of a plus leg (alloy mainly composed of nickel and chromium) and a minus leg (alloy mainly composed of nickel) for a CA thermocouple, 0.32 mm in diameter, were first heat treated in the atmosphere at 800° C. for 15 minutes. Then, a mixed solution of 5 mole percent of tetrabutoxy zirconium, 8 mole percent of water, 10 mole percent of glacial acetic acid and 77 mole percent of butyl alcohol was prepared and further stirred at room temperature for 2 hours, to prepare a sol solution. 2 g of yttrium nitrate six hydrate was added to 100 ml of this sol solution at room temperature.

The aforementioned thermocouple elements were dipped in the sol prepared in the above manner and a DC voltage of 200 V was applied thereto for 2 minutes, whereby white films about 70 μm thick were formed as gels on the surfaces of the thermocouple elements.

The thermocouple elements of the plus and minus legs thus coated with the gels were heat treated at 900° C. for 10 minutes, and thereafter furnace-cooled. After the cooling, it was recognized that yttria-partially stabilized zirconia films of 5 μm thickness were formed.

Then, a substance obtained by diluting 16 percent by weight of polyimide varnish (commercially available under the trademark "Pyre ML" from DuPont Co.) with N-methyl-2-pyrolidone into 5 percent by weight was applied onto the ceramics-coated thermocouple elements. The strands or elements were passed through a furnace at 400° C. at a rate of 3.5 m/min. and fired, thereby forming polyimide films of 3 μm thickness.

The breakdown voltages of the as-obtained strands were measured to be 1.6 kV. As to flexibility, no cracking was caused in the films even if the obtained thermocouple elements were wound on cylinders 1 mm in diameter. The results of a unidirectional abrasion test were 502 g and those of a reciprocating system (w=0.6 kg) were 12 times, showing excellent results also in relation to wear resistance.

Ends of the thermocouple elements of the plus and minus legs were melted and bonded to each other to form a thermocouple, which in turn attained excellent results up to 700° C.

EXAMPLE 4

Respective thermocouple elements of a plus leg (alloy mainly composed of nickel and chromium) and a minus leg (alloy mainly composed of nickel) for a CA thermocouple, 0.16 mm in diameter, were prepared.

A sol was prepared by dripping nitric acid into a mixed solution containing 4 mole percent of tetraethylorthosilicate, 40 mole percent of water and 56 mole percent of ethyl alcohol by an amount of 1/100 with respect to the molar rate of tetraethylorthosilicate and reacting the same at a temperature of 80° C. for 2 hours. 5 g of mica powder of 14 pm nominal mean particle diameter was further mixed into the solution to prepare an electrolyte.

The aforementioned thermocouple elements were dipped in the sol prepared in the above manner and then a DC voltage of 350 V was applied thereto for 2 minutes, whereby white films about 20 μm thick were formed as films on the surfaces of the thermocouple elements.

The thermocouple elements of the plus and minus legs thus coated with the gels were heated at 100° C. for 1 hour, and thereafter quenched. After the cooling, it was recognized that silicon oxide-mica composite films 10 ° m in thickness were formed.

Then, silicone resin (commercially available under the trademark "H-19-2" from Dow Corning Toray Silicon Co., Ltd.) was diluted with xylene, to prepare a 10 percent solution. This silicone resin solution was applied to the outer surfaces of the aforementioned thermocouple elements provided with the silicon oxide-mica composite films, and heated and fired at 300° C. for 5 minutes. This coating and heating/firing step was repeated five times, to obtain coating films 10 μm in thickness.

The as-obtained thermocouple elements were evaluated to recognize breakdown Voltages of 1.0 kV, and, as to flexibility, no cracking was caused in the films even if these strands or elements were wound on cylinders 1 mm in diameter.

Ends of the thermocouple elements of the plus and minus legs were 20 melted and bonded to each other to form a thermocouple, which in turn attained excellent results up to 700° C.

The thermocouple according to the present invention can be applied to a thermocouple to which heat resistance is required or a thermocouple which is employed under an ultrahigh vacuum. Furthermore, the present thermocouple exhibits excellent flexibility while maintaining insulability and avoiding cracking even when the thermocouple elements are bent or tightly wound.

Although the invention has been described with reference to specific example embodiments, it will be appreciated that it is intended to cover all modifications and equivalents within the scope of the appended claims.

What is claimed is:

1. A method of manufacturing a thermocouple, comprising the following steps:
   (a) preparing a sol by hydrolytic reaction and polymerization reaction of a compound selected from the group consisting of metal alkoxides and metal carboxylic esters;
   (b) adding to said sol at least one of an organic compound salt and an inorganic salt;
   (c) dipping a thermocouple element in said salt-containing sol;
   (d) energizing said thermocouple element as a cathode for bonding thereto precursor particulates of metal oxide from said sol; and
   (e) after said step (d), forming a metal oxide containing layer essentially consisting of at least one metal oxide on said thermocouple element by heating said thermocouple element having said particulates bonded thereto.

2. The method of claim 1, wherein said step (a) comprises selecting said compound of step (a) so that said metal oxide containing layer formed in said step (e) comprises a material selected from the group consisting of silicon oxide, aluminum oxide, zirconium oxide and magnesium oxide.

3. The method of claim 2, wherein said material is silicon oxide.

4. The method of claim 2, wherein said material is aluminum oxide.

5. The method of claim 1, further comprising a step of adding a ceramics powder to said sol prepared in said step (a).

6. The method of claim 5, wherein said step of adding a ceramics powder comprises adding a powder selected from the group consisting of mica powder, silicon oxide powder, silicon carbide powder, silicon nitride powder, aluminum oxide powder, boron nitride powder and aluminum nitride powder.

7. The method of claim 1, further comprising a step of oxidizing a surface of said thermocouple element by heating said surface prior to said step (c).

8. The method of claim 1, further comprising a step of forming an insulating ceramics layer on an outer surface of said metal oxide containing layer by heating and decomposing at least one material selected from the group consisting of metal-organic polymers, metal-organic oilgomers and metal-organic monomers applied to said outer surface of said metal oxide containing layer.

9. The method of claim 8, wherein said at least one material selected from the group consisting of metal-organic polymers, metal-organic oligomers and metal-organic monomers is selected from the group consisting of metal alkoxides, metal organic oxide salts, polysilazane, polycarbosilane and polyborosiloxane.

10. The method of claim 8, wherein said at least one material selected from the group consisting of metal-organic polymers, metal-organic oligomers and metal organic monomers contains a material selected from the group consisting of silica, alumina, zirconia, silicon nitride, silicon carbide, aluminum nitride, mixtures thereof and partially stabilized zirconia.

11. The method of claim 1, further comprising a step of forming a heat resistant organic resin layer on an outer surface of said metal oxide containing layer.

12. The method of claim 11, wherein said step of forming an organic resin layer comprises applying a compound selected from the group consisting of polyimide, polyamideimide and silicone resin.

13. The method of claim 1, wherein said compound of said step (a) is a metal alkoxide.

14. The method of claim 1, wherein said compound of said step (a) is a metal carboxylic ester.

15. The method of claim 1, wherein said salt added to said sol in said step (b) is an organic compound salt.

16. The method of claim 1, wherein said salt added to said sol in said step (b) is an inorganic salt of a metal.

17. The method of claim 1, wherein said compound of said step (a) is a metal alkoxide, and said salt added to said sol in said step (b) is an inorganic salt of a metal.

18. The method of claim 17, wherein said step (a) comprises selecting said metal alkoxide so that said metal oxide containing layer formed in said step (e) comprises silicon oxide.

19. The method of claim 1, wherein said step (e) comprises a preliminary substep of removing said thermocouple element from said sol.

20. The method of claim 1, wherein said heating of said step (e) is carried out at a temperature of at least 100°C.

21. The method of claim 1, further comprising a preliminary step of preparing a solution containing an alcohol and said compound selected from the group consisting of metal alkoxides and metal carboxylic esters, and wherein said step (a) comprises carrying out said hydrolytic reaction and said polymerization reaction in said solution.

22. The method of claim 21, wherein said solution prepared in said preliminary step further contains water and an acid.

23. The method of claim 22, wherein said alcohol is selected from the group consisting of butyl alcohol and ethyl alcohol, and wherein a predominant molar proportional amount of said alcohol is present in said solution.

24. The method of claim 1, wherein said step (b) comprises adding said salt to said sol after said step (a) for reducing a conductivity of said sol and for improving an electrophoretic efficiency of said sol.

25. A method of making a thermocouple including a thermocouple element having an oxidized surface and an insulating layer arranged in contact with said oxidized surface, wherein said insulating layer consists of at least one metal oxide selected from the group consisting of silicon oxide, aluminum oxide, zirconium oxide and magnesium oxide, and trace amounts of impurities, wherein said thermocouple element consists of a material having a lower melting temperature than does said insulating layer, and wherein said insulating layer has a thickness of from 2 µm to about 10 µm and maintains electrical insulability even when said thermocoupled element together with said insulating layer is bent with a diameter of curvature from 1 mm to 100 mm, said method comprising the following steps:

(a) forming said oxidized surface of said thermocouple element by heating said thermocouple element;

(b) preparing a sol by hydrolytic reaction and polymerization reaction of a compound selected from the group consisting of alkoxides and carboxylic esters of at least one of silicon, aluminum, zirconium and magnesium;

(c) adding to said sol at least one of an organic compound salt and an inorganic salt;

(d) dipping said thermocouple element having said oxidized surface in said salt-containing sol;

(e) energizing said thermocouple element as a cathode for bonding thereto precursor particulates of said at least one metal oxide from said sol; and (f) after said step (e), forming said insulating layer on said oxidized surface of said thermocouple element by heating said thermocouple element having said particulates bonded thereto.

* * * * *

UNITED STATES PATENT AND TRADEMARK OFFICE
CERTIFICATE OF CORRECTION

PATENT NO. : 5,747,727
DATED : May 5, 1998
INVENTOR(S) : Sawada et al.

It is certified that error appears in the above-indentified patent and that said Letters Patent is hereby corrected as shown below:

On the Title Page: in [30] Foreign Application Priority Data please add the following:

--August 7, 1991 [PCT].............................PCT/JP91/01057--.

In [56] References Cited U.S. PATENT DOCUMENTS, Page 2, line 9, replace "5,057,370 10/1991 Fayeulle et al." by
--5,057,379 10/1991 Fayeulle et al.--.

In [56] OTHER PUBLICATIONS, line 6, after "nium." replace "Thermocpoules" by --Thermocouples--.

Col. 2, line 40, after "about" (2nd. occur.) replace "10 μMm" by --10 μm--.

Col. 6, line 13, after "of" replace "1μm" by --50 μm--.

Col. 7, line 15, after "films" replace "10°m" by --10μm--.
line 33, after "were" delete "20".

Signed and Sealed this

Seventh Day of July, 1998

Attest:

BRUCE LEHMAN

Attesting Officer          Commissioner of Patents and Trademarks